US007170367B2

(12) United States Patent
Cern

(10) Patent No.: US 7,170,367 B2
(45) Date of Patent: Jan. 30, 2007

(54) INDUCTIVE COUPLER FOR POWER LINE COMMUNICATIONS

(75) Inventor: Yehuda Cern, Brookline, MA (US)

(73) Assignee: Ambient Corporation, Newton, MA (US)

( * ) Notice: Subject to any disclaimer, the term of this patent is extended or adjusted under 35 U.S.C. 154(b) by 0 days.

(21) Appl. No.: 10/973,087

(22) Filed: Oct. 25, 2004

(65) Prior Publication Data

US 2006/0087382 A1 Apr. 27, 2006

(51) Int. Cl.
*H03H 2/00* (2006.01)
*G05G 11/01* (2006.01)

(52) U.S. Cl. ................................ 333/24 R; 340/310.17

(58) Field of Classification Search .............. 333/24 R; 340/310.17

See application file for complete search history.

(56) References Cited

U.S. PATENT DOCUMENTS 4,004,110 A 1/1977 Whyte
4,016,429 A 4/1977 Vercellotti
4,142,178 A * 2/1979 Whyte et al. ............... 307/149
4,188,619 A 2/1980 Perkins
4,254,402 A 3/1981 Perkins
4,259,716 A * 3/1981 Harris et al. .................. 363/97
4,323,882 A 4/1982 Gajjar
4,357,598 A 11/1982 Melvin, Jr.
4,408,186 A 10/1983 Howell
4,433,284 A 2/1984 Perkins
4,473,816 A 9/1984 Perkins
4,481,501 A 11/1984 Perkins
4,602,240 A 7/1986 Perkins et al.
4,646,319 A * 2/1987 Engel et al. ................ 375/220
4,675,648 A 6/1987 Roth et al.
4,745,391 A 5/1988 Gajjar
4,903,006 A 2/1990 Boomgaard
5,210,519 A 5/1993 Moore
5,257,006 A 10/1993 Graham et al.
5,301,208 A 4/1994 Rhodes
5,351,272 A 9/1994 Abraham
5,406,249 A 4/1995 Pettus
5,559,377 A 9/1996 Abraham
5,684,450 A 11/1997 Brown
5,694,108 A 12/1997 Shuey
5,717,685 A 2/1998 Abraham
5,777,789 A 7/1998 Chiu et al.
5,815,062 A * 9/1998 Koyuhara et al. .......... 336/233
5,856,776 A 1/1999 Armstrong et al.
5,864,284 A 1/1999 Sanderson
6,160,697 A * 12/2000 Edel ........................... 361/143
6,191,673 B1 * 2/2001 Ogura et al. .............. 336/84 R
6,452,482 B1 9/2002 Cern
6,512,438 B1 * 1/2003 Yoshimori et al. .......... 336/178
6,844,810 B2 * 1/2005 Cern .......................... 375/258
6,933,835 B2 * 8/2005 Kline ......................... 398/116
2003/0222748 A1 12/2003 Cern et al.

* cited by examiner

*Primary Examiner*—Robert Pascal
*Assistant Examiner*—Kimberly E. Glenn
(74) *Attorney, Agent, or Firm*—Ohlandt, Greeley, Ruggiero & Perle, LLP

(57) ABSTRACT

There is provided an inductive coupler for coupling a data signal to a power line. The inductive coupler includes a split magnetic core having an aperture formed by an upper magnetic core and a lower magnetic core. The aperture permits the power line to pass therethrough as a primary winding, the upper magnetic core is for making electrical contact with an outer surface of the power line, and the lower magnetic core makes electrical contact with the upper magnetic core.

36 Claims, 4 Drawing Sheets

INDUCTIVE COUPLER FOR POWER LINE COMMUNICATIONS

BACKGROUND OF THE INVENTION

1. Field of the Invention

The present invention relates to communication of a data signal over a power distribution system. More particularly, the present invention relates to a use of an inductive coupler for coupling of a data signal via a conductor in a power transmission cable.

2. Description of the Related Art

In power line communication (PLC), a data coupler couples a data signal between a power line and a communications device, such as, for example, a modem. Radio frequency (rf) modulated data signals can be coupled to and communicated over medium and low voltage power distribution networks.

An example of such a data coupler is an inductive coupler. A power line inductive coupler is basically a transformer whose primary is connected to the power line and whose secondary is connected to the communications device, such as the modem. Examples of inductive couplers and their use are described in U.S. Pat. No. 6,452,482, U.S. patent application Ser. No. 10/429,169 and U.S. patent application Ser. No. 10/688,154, all of which are assigned to the assignee of the present application, and the disclosures of which are incorporated herein by reference.

The inductive couplers achieve a series coupling, which is capable of launching PLC signals with frequencies from below 4 megahertz (MHz) through in excess of 40 MHz along overhead and underground power cables. Unfortunately, in most cases, the power line wires cannot be interrupted. This limits, to a "single turn winding", the primary winding passing through the inductive coupler. Where the power line impedance is higher than the modem impedance, impedance matching in the data coupler is difficult because while the primary winding is limited to the single turn, the secondary winding cannot be less than a single turn.

Magnetic circuits including inductive couplers exhibit non-linear properties, such as the non-linearity of the circuit's Magnetic Flux Density vs. Applied Magnetizing Force (B-H) curve. This non-linearity, in conjunction with the magneto-motive force rising from zero to a maximum, twice each cycle of the power frequency, causes distortion. The distortion includes amplitude modulation of the transmitted and received signals. The modem or other communication device will begin to suffer data errors at some threshold level of this distortion.

Accordingly, there is a need for an inductive coupler and a corresponding circuit that improves impedance matching between the power line and the communication device or modem. There is a further need for an inductive coupler that reduces distortion of the transmitted and received signals. The apparatus and method of the present invention provides for series coupling of a data signal via a conductor and circuit on a power transmission cable that improves impedance matching and reduces distortion of the signals.

SUMMARY OF THE INVENTION

It is an object of the present invention to provide an improved coupler for coupling a data signal to a conductor in a power transmission cable.

It is another object of the present invention to provide such a coupler that is inexpensive and has a high data rate capacity.

It is a further object of the present invention to provide such a coupler that can be installed without interrupting service to power customers.

These and other objects of the present invention are achieved by a method for configuring components for power line communications, comprising installing an inductive coupler that employs a power line conductor as a primary winding; connecting a communications device to a secondary winding of the inductive coupler; and connecting an rf signal transformer between the secondary winding and the communications device, in which a turns ratio of the rf signal transformer is 2:1.

In a further embodiment, an arrangement of components for coupling data between a power line and a communications device is provided. The arrangement comprises an inductive coupler that employs a power line conductor as a primary winding, and an rf signal transformer for connecting a communications device to a secondary winding of the inductive coupler. The rf signal transformer has a turns ratio of 2:1.

In another embodiment, an inductive coupler for coupling a data signal between a communications device and a power line is provided, comprising: a magnetic core having an aperture formed by a first section and a second section; and a secondary circuit having a winding passing through the aperture as a secondary winding connected to the communications device. The aperture permits the power line to pass therethrough as a primary winding and the inductive coupler has a primary inductance of about 1.5 μH to about 2.5 μH.

In yet another embodiment, an inductive coupler for coupling a data signal between a communications device and a power line is provided. The inductive coupler comprises: a split magnetic core having an aperture formed by a first section and a second section; and a secondary circuit having a winding passing through the aperture as a secondary winding connected to the communications device. The first and second sections form a gap therebetween and the aperture permits the power line to pass therethrough as a primary winding.

In yet a further embodiment, an inductive coupler for coupling a data signal between a communications device and a power line is provided, comprising: a primary winding which employs the power line and a secondary circuit having a secondary winding connected to the communications device. The inductive coupler has a path loss of less than about 10 dB.

The aperture of the magnetic core can have a diameter of about 1.5 inches. The magnetic core has a radial thickness that can be less than the diameter of the aperture. The gaps in the magnetic core may be about 30 mils. The magnetic core can weigh less than about 10 pounds. The magnetic core may be made of nano-crystalline magnetic material.

DETAILED DESCRIPTION OF THE INVENTION

Overhead and underground transmission lines may be used for the bi-directional transmission of digital data called Power Line Communications (PLC) or Broadband Over Power Lines (BPL). Such transmission lines cover the path between a power company's transformer substation and one or more medium voltage-low voltage (MV-LV) distribution transformers placed throughout a neighborhood. The MV-LV distribution transformers step the medium voltage power down to low voltage, which is then fed to homes and businesses.

The present invention relates to a use of a coupler in a medium voltage grid. The coupler is for enabling communication of a data signal via a power transmission cable. It has a first winding for coupling the data signal via a conductor of the power transmission cable, and a second winding, inductively coupled to the first winding, for coupling the data signal via a data port.

Figure 1:
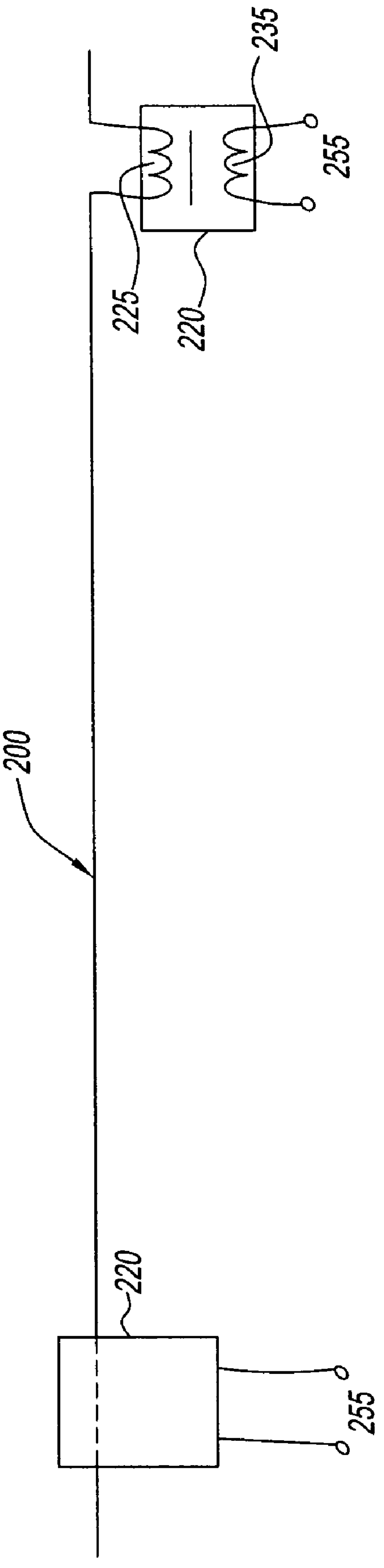
FIG. 1 is an illustration of an arrangement of a power line and an inductive coupler for data communication, in accordance with the present invention.

Referring to FIG. 1, an illustration of an arrangement of a power line being used for data communication, is shown. A power line or cable 200 has an inductive coupler 220 situated thereon.

Power line 200 serves as a first winding 225 of coupler 220. A second winding 235 of coupler 220 is coupled to a port 255 through which data is transmitted and received. Thus, cable 200 is enlisted for use as a high frequency transmission line, which can be connected to communications equipment such as a modem (not shown), via coupler 220.

Coupler 220 is an rf transformer. The impedance across the primary, i.e., first winding 225, of such a transformer is negligible at the frequencies used for conducting power.

Figure 2:
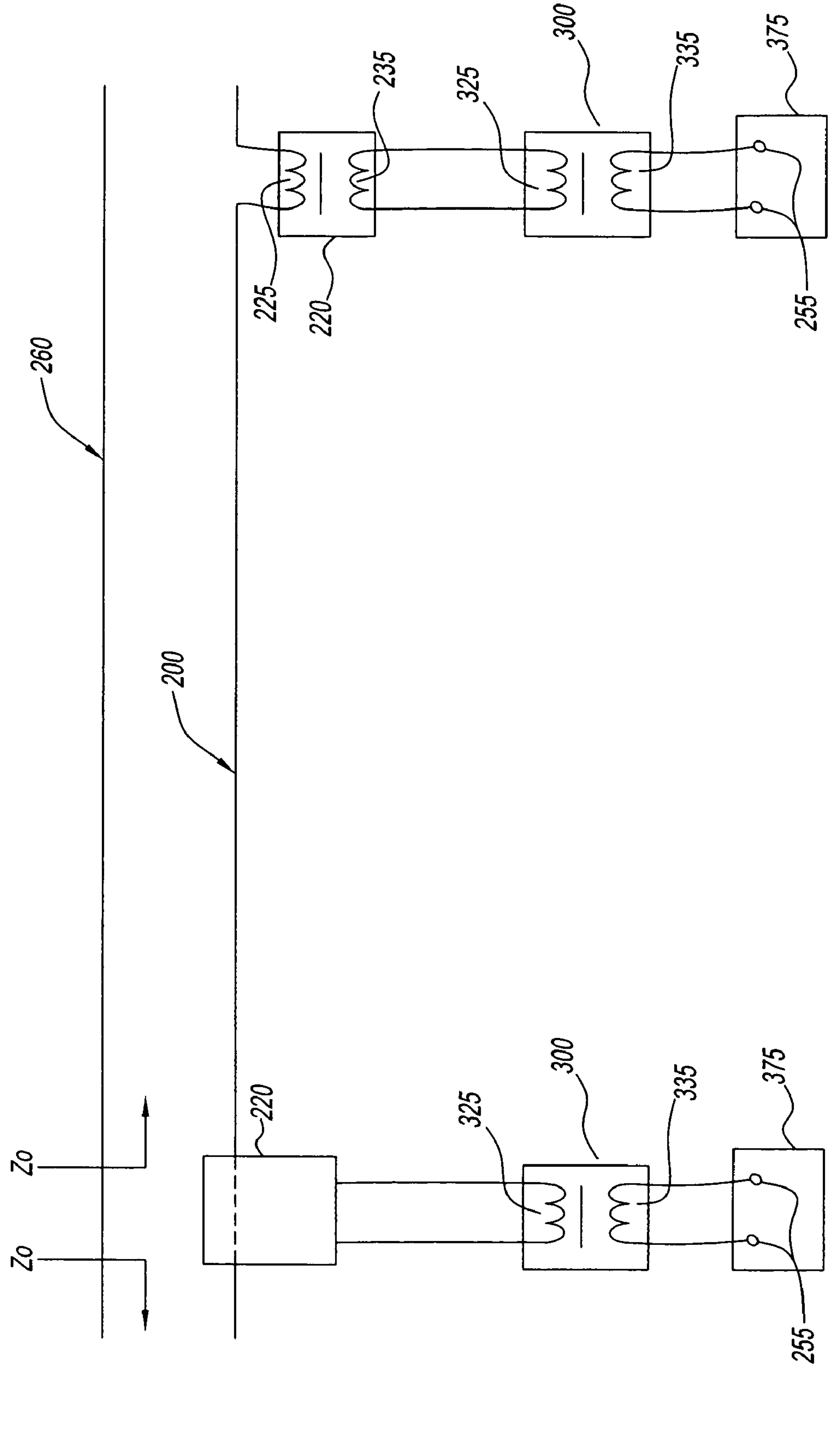
FIG. 2 is a schematic representation of the data communication arrangement of FIG. 1 with an impedance matching circuit for the inductive coupler.

Referring to FIG. 2, the cable 200 and coupler 220, as described above with respect to FIG. 1, are again shown, with similar features represented by the same reference numerals. Also shown is a second power conductor 260, representing a second primary wire of different phase or representing a neutral wire. Where cables 200 and 260 are overhead lines, the characteristic impedance $Z_o$ of overhead lines to differential signals is at least on the order of 100 ohms. The primary winding 225 "sees" this impedance twice, i.e., once on each end of the coupler 220, for a total impedance of at least on the order of 200 ohms.

Modem 375 has an impedance that is typically on the order of about 50 ohms. Impedance matching through use of the proper turns ratio at the coupler 220 cannot be accomplished where the cable 200 is to be left undisturbed. Thus, under these conditions, the turns ratio at the coupler 220 is 1:1 with only a single turn used for the primary and secondary windings. This means that the impedance seen from the secondary winding is nominally the same as the impedance seen by the primary winding, i.e., on the order of 200 ohms.

To improve the impedance matching for the PLC with use of the modem 375 having the characteristic impedance described above, an rf signal transformer 300 is connected between the secondary winding 235 of the coupler 220 and the modem. The rf transformer 300 has a primary winding 325 and a secondary winding 335. Based upon the impedance characteristics described above for the power line 200 and the modem 375, the turns ratio for the rf signal transformer 300 should be 2:1.

Figures 3, 4:
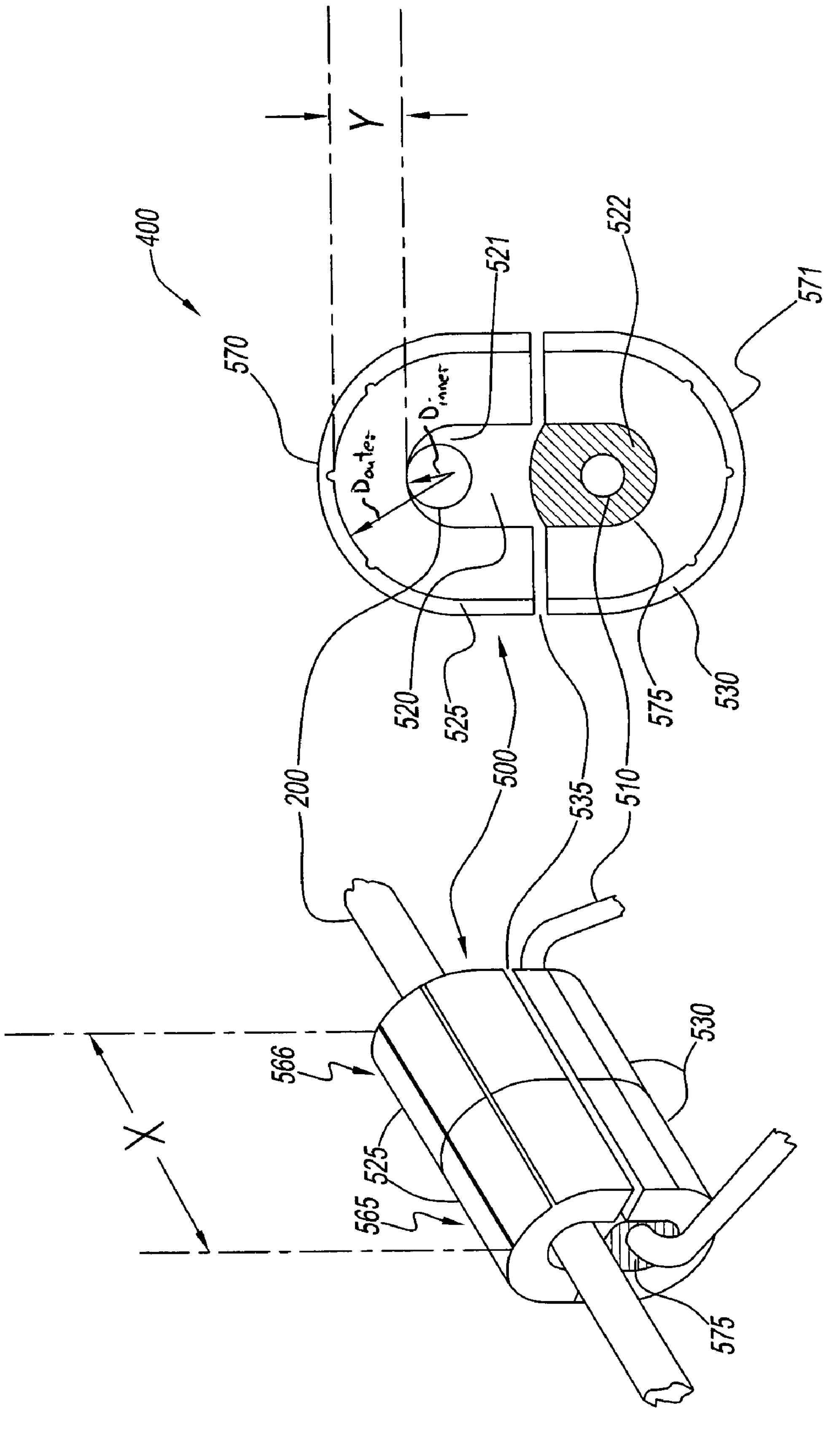
FIG. 3 is a perspective view of an inductive coupler having a magnetic core, a primary winding and a secondary winding.
FIG. 4 is a cross-sectional view of the inductive coupler of FIG. 3.

Referring to FIGS. 3 and 4, an inductive coupler 400 is shown, which is used as described above with respect to coupler 220 of FIGS. 1 and 2. Coupler 400 has a magnetic core 500, comprising core sets 565 and 566. A plastic packaging material, i.e., plastic layers 570 and 571, can be used to bind core sets 565 and 566 together. Magnetic core 500 includes an aperture 520. Phase line 200 passes through an upper section 521 of aperture 520. A secondary winding 510 and a secondary insulation 575 pass through a lower section 522 of aperture 520. Magnetic core 500 is thus a composite split core that can be used in an inductive coupler and allows for placement of the inductive coupler 400 over an energized power line, e.g., energized phase line 200.

Aperture 520 is preferably oblong or oval so as to accommodate the phase line 200, that may be of a large diameter, and the secondary insulation 575 that may be a thick layer of insulation. Such an oblong or oval shape can be achieved, for example, by configuring split core 500 with a first section and a second section, i.e., an upper core 525 and a lower core 530, that are horseshoe-shaped to provide a racecourse shape for magnetic core 500, thereby accommodating phase line 200 being large and secondary insulation 575 being thick.

Upper and lower cores 525 and 530 are magnetic and have a high permittivity. Upper and lower cores 525 and 530 act as conductors to high voltage since voltage drop is inversely proportional to capacitance and capacitance is proportional to permittivity. Upper core 525 is in contact with phase line 200. Thus, upper core 525 is energized to avoid intense electric fields near the phase line 200, which also avoids local discharges through the air.

Upper and lower cores 525 and 530 may optionally be placed in electrical contact with each other, so as to preclude a voltage difference between them. Such voltage difference, if sufficiently large, would cause a discharge through the air gap 535 between them, generating electrical noise, which could interfere with coupler operation and could generate interference with radio receivers in the vicinity. Optionally, upper and lower cores 525 and 530 may be coated with a semiconducting layer that would further reduce electric fields in the region of the cores, so precluding discharge.

During receipt of a data signal, the impedance of magnetization inductance of the primary winding of the coupler 400 is in shunt with the signal. In order to prevent most of the signal current from flowing through the magnetization inductance of the coupler 400 and failing to reach the modem when receiving a signal, the impedance of the primary winding of the coupler should not be much smaller than the rf characteristic impedance of the power line 200. Similarly, during transmission of the signal, most of the transmitter current would flow through the magnetization inductance of the coupler 400 and not through power line 200, if the impedance of the primary winding of the coupler were much smaller than the rf characteristic impedance of the power line.

The magnitude of the rf impedance of the primary winding of coupler 400 can be approximated by:

$$|Z|\approx 2\pi fL_p$$

where f is the frequency in MHz and $L_p$ is the primary inductance in microhenries. This approximation ignores losses across the coupler 400. For a magnetic coupling coefficient k approaching unity, the primary winding impedance and the impedance of the magnetization inductance are nearly equal.

To minimize the receiving and transmitting effects of the primary inductance $L_p$ of the coupler 400, the magnitude of the primary winding impedance $|Z|$ should be a significant portion of the characteristic impedance of the power line 200. However, since the power line 200 is to be left undisturbed and is thus limited to a single turn, the turns ratio of coupler 400 cannot be utilized to achieve this minimization.

A desired primary inductance can be achieved through manipulation of the magnetic core 500. The upper and lower magnetic cores 525 and 530 must provide a magnetic circuit with a sufficiently low magnetic resistance. The magnetic resistance of the upper and lower magnetic cores 525 and 530 is proportional to the magnetic path length l (mean circumference of the cores) and inversely proportional to the cross-sectional area A and to the permeability μ:

$$L \sim 1/R_{mag} \text{ and } R_{mag} \sim l/(\mu A)$$

Therefore:

$$L \sim \mu A/l$$

where the cross-sectional area A is the product of the radial thickness Y (shown in FIG. 4) of the magnetic core 500 and its longitudinal dimension X (shown in FIG. 3). Of course, due to manufacturing constraints, the radial thickness Y and longitudinal dimension X of the magnetic core 500 are not without limit.

The lower bound for the magnetic path length l is determined at least in part by the diameter of the largest wire that the coupler 400 can accommodate, as well as by the thickness of the insulation 575 around the secondary winding 510. For typical medium voltage conductors, the inner diameter $D_{inner}$ of magnetic core 500 should be about 1.5 inches.

It has been found that the radial thickness Y should be less than the inner diameter $D_{inner}$. This prevents the magnetic path length l along the outer diameter $D_{outer}$ from far exceeding the magnetic path length along the inner diameter $D_{inner}$. Since the magneto-motive force is inversely proportional to the magnetic path length l, the magnetic path along the inner diameter $D_{inner}$ would saturate at a far lower AC power current than the magnetic path along the outer diameter $D_{outer}$. The magnetic material along the outer portion of the magnetic core 500 can thus be more efficiently utilized if the longitudinal dimension X, rather than the radial thickness Y, is increased.

At radio frequencies up to tens of megahertz, available magnetic materials are limited in both permeability and maximum magnetic flux density. In general, lower permeability materials have a higher maximum flux density.

Figure 5:
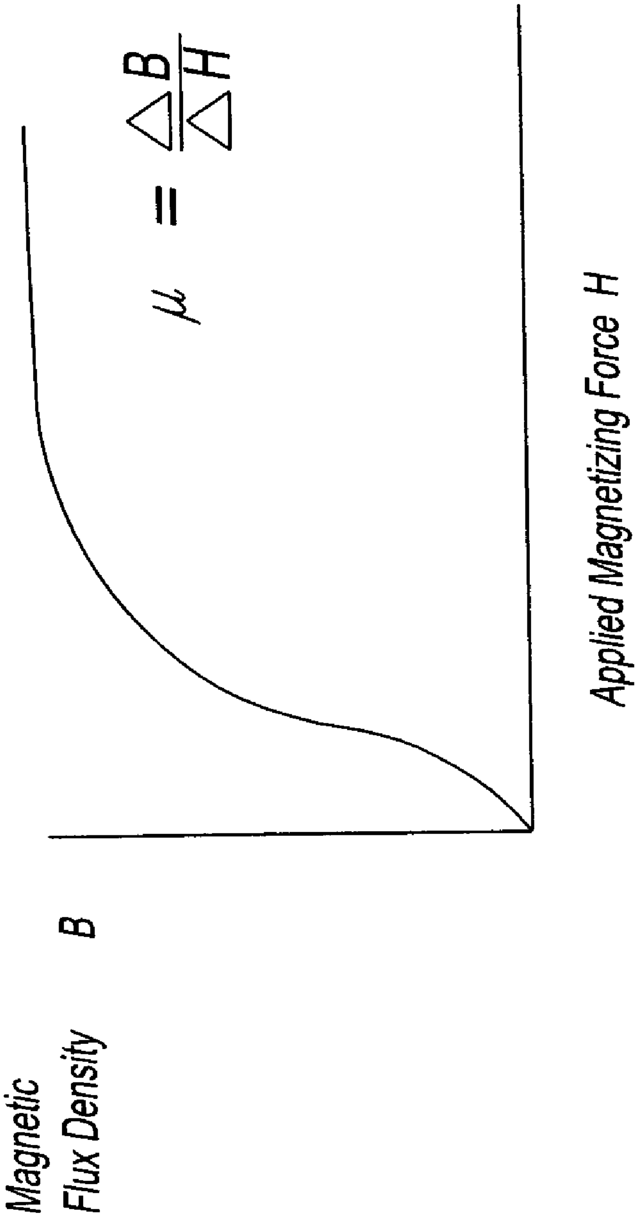
FIG. 5 is an illustration of a Magnetic Flux Density vs. Applied Magnetizing Force (B-H) curve showing the non-linearity for a typical ferrite material.

Referring to FIGS. 3 through 5, an example of the non-linear properties of coupler 400, and magnetic circuits in general, is shown in the B-H curve of a typical ferrite material. To mitigate distortion of the transmitted and received signals due to such non-linearity, air gap 535 can be introduced into the magnetic circuit of the coupler 400. Air gap 535 is a spacer in the magnetic core 500 on one or more pole faces of the magnetic core.

It has been discovered that for a coupler frequency response extending downwards as low as 4 MHz, the primary inductance of coupler 400 should reach at least 1.5 microhenries (μH). For a wideband coupler where the upper frequency limit is many times larger than a low frequency cutoff, there is a tradeoff between the benefit of a lower low frequency cutoff due to increased inductance and the increased coupler to line attenuation due to leakage inductance. This leakage inductance is due to the flux leakage at the air gaps 535 and the limited permeability of the magnetic core material.

Leakage inductance appears in series between the power line 200 and the secondary winding 510 of the coupler 400, and its reactance increases with frequency. For a coupler intended to preferably operate in the range from below 4 MHz through in excess of 40 MHz, and using a practical range of magnetic coupling coefficients, it has been discovered that the primary inductance of the coupler 400 should not exceed 2.5 μH. Based upon this, it has been discovered that the optimal primary inductance for the coupler 400 is in the range of 1.5 μH to 2.5 μH.

It has also been discovered that for a coupler 400 having an inner diameter $D_{inner}$ of at least 1.5 inches and a magnetic core weight not exceeding about ten pounds, the equivalent relative permeability μ, including core and air gap, is in the range of about 200 to 300. In order to reach a power current capacity of at least 200 Amps rms, it was discovered that air gaps 535 having a thickness or spacing of about 30 mils or about 0.76 mm should be used on each of two pole faces of the magnetic core 500, providing about triple the magnetic resistance of the magnetic cores 500. The air gaps 535 increase the current capacity by a factor of about eight, while reducing the inductance by a factor of about three. The air gaps 535 reduce the effects of variations in incidental gaps caused by geometrical imperfections at the mating of the pole faces of the magnetic core 500 and reduce the effects of manufacturing variations in core material permeability. Additionally, the air gaps 535 reduce rf core losses. It has been discovered that the magnetic cores 500 should have an initial relative permeability μ in the range of 600 to 1000.

These unexpected results occurred for the use of a ferrite magnetic material for the magnetic core 500. Ferrite cores typically saturate at flux densities in the 2800 to 4800 Gauss range. Powdered metal cores have a higher saturation flux densities than ferrite cores, but a relative permeability μ no higher than 100. The total weight of the powdered metal cores needed would be several times that needed by ferrite cores. It has been discovered that coupler 400, as described above, when used with an impedance matching transformer, such as, for example, transformer 300 of FIG. 2, can achieve path losses in the 6 to 10 dB range per coupler when used on overhead lines.

For power lines conducting currents in excess of about 200 Amps, ferrite core material may be replaced by nanocrystalline cores. With the dimensions discussed here, power currents of 600 Amps may be accommodated without excessive saturation.

While the instant disclosure has been described with reference to one or more exemplary embodiments, it will be understood by those skilled in the art that various changes may be made and equivalents may be substituted for elements thereof without departing from the scope thereof. In addition, many modifications may be made to adapt a particular situation or material to the teachings of the disclosure without departing from the scope thereof. Therefore, it is intended that the disclosure not be limited to the particular embodiment(s) disclosed as the best mode contemplated for carrying out this invention, but that the invention will include all embodiments falling within the scope of the appended claims.

What is claimed is:

1. A method for configuring components for power line communications, comprising:

installing an inductive coupler that employs a power line conductor as a primary winding;

connecting a communications device to a secondary winding of said inductive coupler; and connecting an rf signal transformer between said secondary winding and said communications device, wherein said rf signal transformer has a turns ratio of 2:1.

2. The method of claim 1, further comprising applying a primary inductance via the inductive coupler of between about 1.5 pH to about 2.5 μH.

3. The method of claim 1, wherein path loss for said inductive coupler is less than about 10 dB.

4. The method of claim 1, further comprising reducing distortion in the power line communications by introducing gaps in a magnetic core of said inductive coupler.

5. The method of claim 1, wherein said rf signal transformer comprises cores made of nano-crystalline magnetic material.

6. An arrangement of components for coupling data between a power line and a communications device, comprising: an inductive coupler that employs a power line conductor as a primary winding; and an rf signal transformer for connecting a communications device to a secondary winding of said inductive coupler, wherein said rf signal transformer has a turns ratio of 2:1.

7. The arrangement of claim 6, wherein said inductive coupler has a primary inductance of about 1.5 μH to about 2.5 μH.

8. The arrangement of claim 6, wherein path loss for the arrangement of components are less than about 10 dB.

9. The arrangement of claim 6, wherein said inductive coupler has a magnetic core with an aperture formed therethrough, said aperture permitting said primary and secondary windings to pass therethrough, and wherein said aperture has a diameter of about 1.5 inches.

10. The arrangement of claim 9, wherein said magnetic core has a radial thickness, and wherein said radial thickness is less than said diameter of said aperture.

11. The arrangement of claim 9, wherein said magnetic core has a pair of gaps formed on opposing sides of said magnetic core, and wherein said gaps have a thickness of about 30 mils.

12. The arrangement of claim 9, wherein said magnetic core weighs less than about 10 pounds.

13. The arrangement of claim 6, wherein said rf signal transformer comprises magnetic cores made of nano-crystalline magnetic material.

14. An inductive coupler for coupling a data signal between a communications device and a power line, comprising: a magnetic core having an aperture formed by a first section and a second section, the first and second sections forming a gap therebetween, wherein said aperture permits the power line to pass therethrough as a primary winding; and a secondary circuit having a winding passing through said aperture as a secondary winding connected to said communications device, wherein said magnetic core has a radial thickness, wherein said aperture has a diameter, wherein said radial thickness is less than said diameter and wherein the inductive coupler has a path loss that is less than about 10 dB.

15. The inductive coupler of claim 14, wherein said aperture has a diameter of about 1.5 inches.

16. The inductive coupler of claim 14, wherein said magnetic core is made of nano-crystalline magnetic material.

17. The inductive coupler of claim 14, wherein the inductive coupler has a primary inductance of about 1.5 μH to about 2.5 μH.

18. The inductive coupler of claim 14, wherein said magnetic core has a pair of gaps formed on opposing sides of said magnetic core, and wherein said gaps have a thickness of about 30 mils.

19. The inductive coupler of claim 14, wherein said magnetic core weighs less than about 10 pounds.

20. The inductive coupler of claim 14, wherein said secondary circuit has an rf signal transformer connected between said communications device and said secondary winding, and wherein said rf signal transformer has a turns ratio of 2:1.

21. An inductive coupler for coupling a data signal between a communications device and a power line, comprising: a split magnetic core having an aperture formed by a first section and a second section, said first and second sections forming a pair of gaps formed on opposing sides of said magnetic core, said aperture permitting the power line to pass therethrough as a primary winding; and a secondary circuit having a winding passing through said aperture as a secondary winding connected to said communications device, wherein said split magnetic core weighs less than about 10 pounds.

22. The inductive coupler of claim 21, wherein each of said pair of gaps has a thickness of about 30 mils.

23. The inductive coupler of claim 21, wherein said split magnetic core is made of nano-crystalline magnetic material.

24. The inductive coupler of claim 21, wherein said aperture has a diameter of about 1.5 inches.

25. The inductive coupler of claim 21, further comprising a primary inductance of about 1.5 μH to about 2.5 μH.

26. The inductive coupler of claim 21, wherein said split magnetic core has a radial thickness, wherein said aperture has a diameter, and wherein said radial thickness is less than said diameter.

27. The inductive coupler of claim 21, wherein path loss for the inductive coupler is less than about 10 dB.

28. The inductive coupler of claim 21, wherein said secondary circuit has an rf signal transformer connected between said communications device and said secondary winding, and wherein said rf signal transformer has a turns ratio of 2:1.

29. An inductive coupler for coupling a data signal between a communications device and a power line, comprising: a core having an aperture through which the power line is routed to serve as a primary winding, and a secondary circuit having a secondary winding connected to the communications device, wherein the inductive coupler has a path loss of less than about 10 dB.

30. The inductive coupler of claim 29, wherein said core comprises a magnetic core having said aperture formed by a first section and a second section, wherein the secondary circuit passes through said aperture, and wherein the inductive coupler has a primary inductance of about 1.5 μH to about 2.5 μH.

31. The inductive coupler of claim 30, wherein said aperture has a diameter of about 1.5 inches.

32. The inductive coupler of claim 30, wherein said magnetic core has a radial thickness, wherein said aperture has a diameter, and wherein said radial thickness is less than said diameter.

33. The inductive coupler of claim 30, wherein said magnetic core has a pair of gaps formed on opposing sides of said magnetic core, and wherein said gaps have a thickness of about 30 mils.

34. The inductive coupler of claim 30, wherein said magnetic core weighs less than about 10 pounds.

35. The inductive coupler of claim 30, wherein said secondary circuit has an rf signal transformer connected between said communications device and said secondary winding, and wherein said rf signal transformer has a turns ratio of 2:1.

36. The inductive coupler of claim 30, wherein said magnetic core is made of nano-crystalline magnetic material.

* * * * *

UNITED STATES PATENT AND TRADEMARK OFFICE

CERTIFICATE OF CORRECTION

PATENT NO. : 7,170,367 B2
APPLICATION NO. : 10/973087
DATED : January 30, 2007
INVENTOR(S) : Cern It is certified that error appears in the above-identified patent and that said Letters Patent is hereby corrected as shown below:

IN THE SPECIFICATION

In Column 3, Line 12, delete “Over” and insert -- over --, therefor.

IN THE CLAIMS

In Column 7, Line 13, in Claim 2, delete “pH” and insert -- μH --, therefor.

Signed and Sealed this
Ninth Day of February, 2016

Michelle K. Lee
*Director of the United States Patent and Trademark Office*